(12) United States Patent
Cassidy et al.

(10) Patent No.: US 9,578,762 B2
(45) Date of Patent: Feb. 21, 2017

(54) TELEVISION MONITOR COMBINATION STAND AND WALL MOUNT

(71) Applicants: Timothy M. Cassidy, Plymouth, MN (US); Yang Du, Guangdong (CN); He Kaizuan, Guangdong (CN)

(72) Inventors: Timothy M. Cassidy, Plymouth, MN (US); Yang Du, Guangdong (CN); He Kaizuan, Guangdong (CN)

(73) Assignee: BBY SOLUTIONS, INC., Richfield, MN (US)

( * ) Notice: Subject to any disclaimer, the term of this patent is extended or adjusted under 35 U.S.C. 154(b) by 0 days.

(21) Appl. No.: 14/753,492

(22) Filed: Jun. 29, 2015

(65) Prior Publication Data
US 2015/0305178 A1  Oct. 22, 2015

Related U.S. Application Data

(63) Continuation of application No. 14/048,550, filed on Oct. 8, 2013, now Pat. No. 9,072,379.

(51) Int. Cl.

| | |
|---|---|
| *F16M 13/00* | (2006.01) |
| *H05K 5/02* | (2006.01) |
| *F16M 11/38* | (2006.01) |
| *A47B 85/00* | (2006.01) |
| *A47B 97/00* | (2006.01) |
| *F16M 11/10* | (2006.01) |
| *F16M 13/02* | (2006.01) |
| *A47B 81/06* | (2006.01) |
| *H05K 5/00* | (2006.01) |

(52) U.S. Cl.
CPC .......... *H05K 5/0204* (2013.01); *A47B 81/06* (2013.01); *A47B 85/00* (2013.01); *A47B 97/001* (2013.01); *F16M 11/10* (2013.01); *F16M 11/38* (2013.01); *F16M 13/02* (2013.01); *H05K 5/0017* (2013.01); *A47B 2097/005* (2013.01); *F16M 13/00* (2013.01); *F16M 2200/08* (2013.01)

(58) Field of Classification Search
CPC . A47G 1/142; A47G 1/00; A47G 1/14; H05K 5/0204; F16M 11/38; F16M 13/00
See application file for complete search history.

(56) References Cited

U.S. PATENT DOCUMENTS

| | | | | |
|---|---|---|---|---|
| 4,290,216 A | * | 9/1981 | Gale | A47G 1/142 248/470 |
| 4,432,152 A | * | 2/1984 | Daenen | A47G 1/065 40/762 |

\* cited by examiner

*Primary Examiner* — Amy Sterling
(74) *Attorney, Agent, or Firm* — Beck Tysver Evans, PLLC (57) ABSTRACT

A combination television monitor stand and wall mount is presented. The combination stand and mount has an assembly of parts that can be assembled into two different configurations. The parts assembly includes a base plate, brackets, screws, and a stand cover. In a stand configuration, the described apparatus functions as a table stand for a television or computer monitor. In a wall mount configuration, the described apparatus allows a monitor to be mounted to a wall. A second embodiment provides a stand configuration having a neck pivotably attached to a base plate by a hinge, and a locking lever arm supporting the neck when the neck is in an upright position.

15 Claims, 15 Drawing Sheets

TELEVISION MONITOR COMBINATION STAND AND WALL MOUNT

CROSS-REFERENCE TO RELATED APPLICATIONS

This application is a Continuation and claims the benefit of U.S. patent application Ser. No. 14/048,550 filed Oct. 8, 2013, now issued as U.S. Pat. No. 9,072,379; the entire content of which is hereby incorporated herein by reference.

FIELD OF THE INVENTION

The present application relates to the field of stands and wall mounts for televisions and computer monitors. More particularly, the described embodiments relate to a modular television stand assembly that converts into a wall mount assembly.

SUMMARY

One embodiment of the present invention provides a collection of components that can be assembled into either a television monitor stand or a television monitor wall mount. The components include a base plate, brackets, screws or other such fasteners, and a stand cover that may be provided in multiple sections.

DETAILED DESCRIPTION

Figure 1:
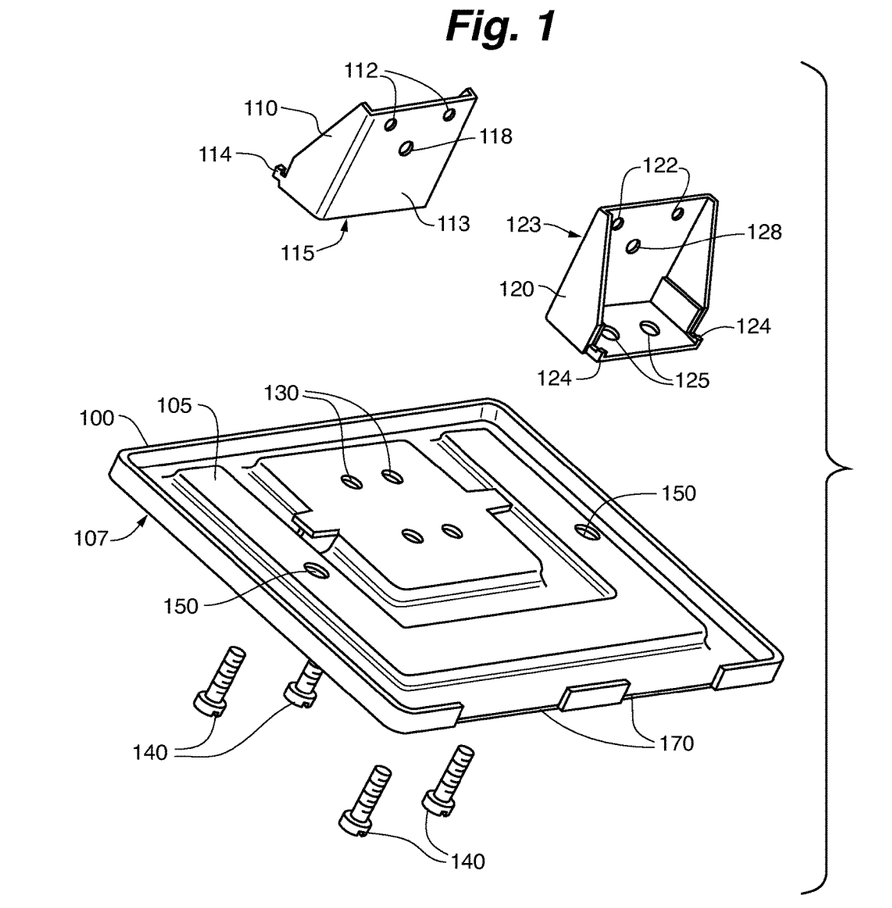
FIG. 1 is a perspective view of a combination stand and mount.

FIG. 1 shows the basic modular components of one embodiment of the present disclosure. The parts include a base plate 100, two brackets 110 and 120, and four fasteners, such as screws 140. In one embodiment the brackets 110, 120 may be identical. Base plate 100 has a front face 107 and a back face 105. The base plate 100 also has multiple screw holes 130, 150. Screw holes 130 are used to secure brackets 110, 120 when the combination stand/mount is in a stand configuration. Screw holes 150 are used to secure the base plate 100 to a wall in a wall mount configuration.

Figure 3:
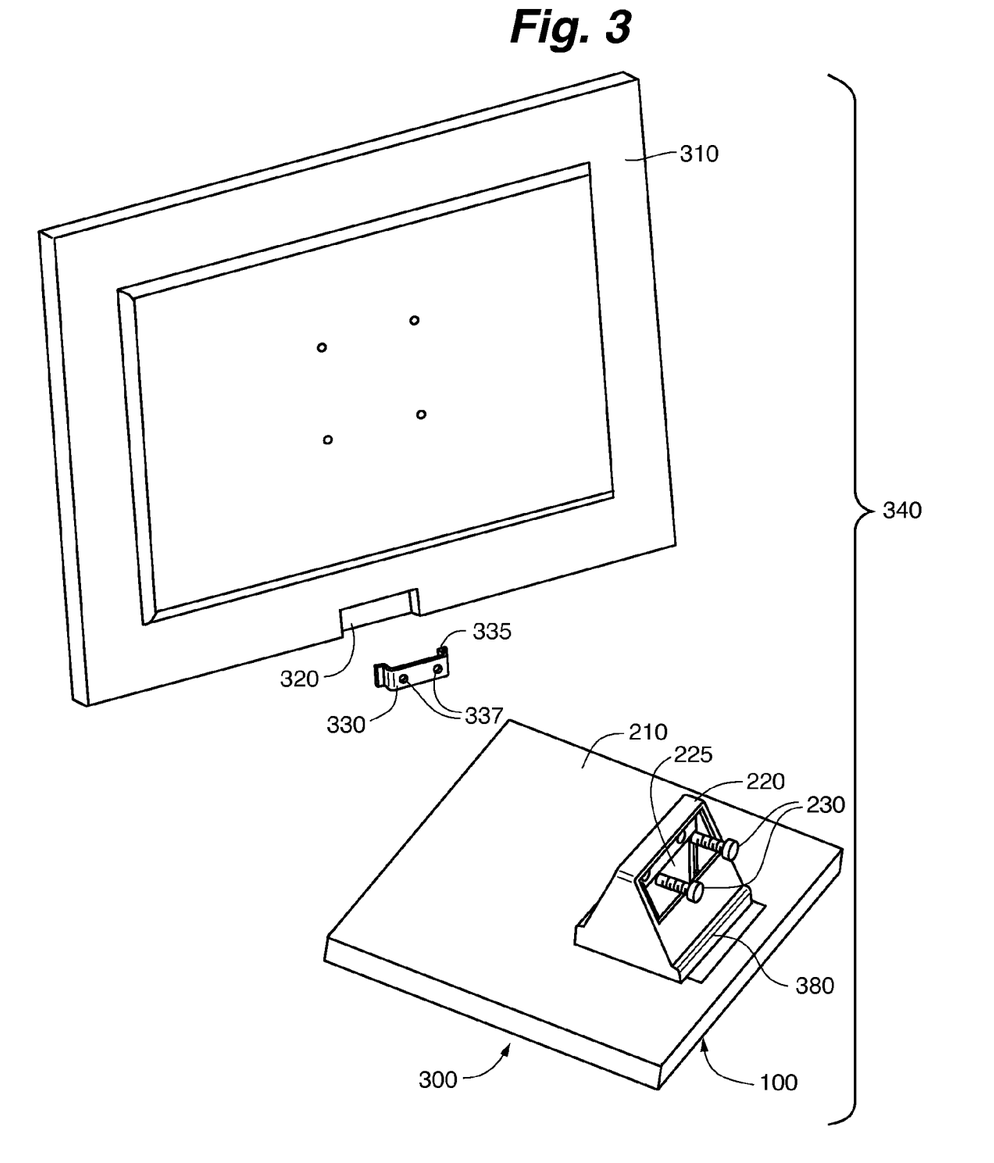
FIG. 3 is a first perspective view of the combination stand and mount in stand configuration coupled with a television monitor.
Figure 6:
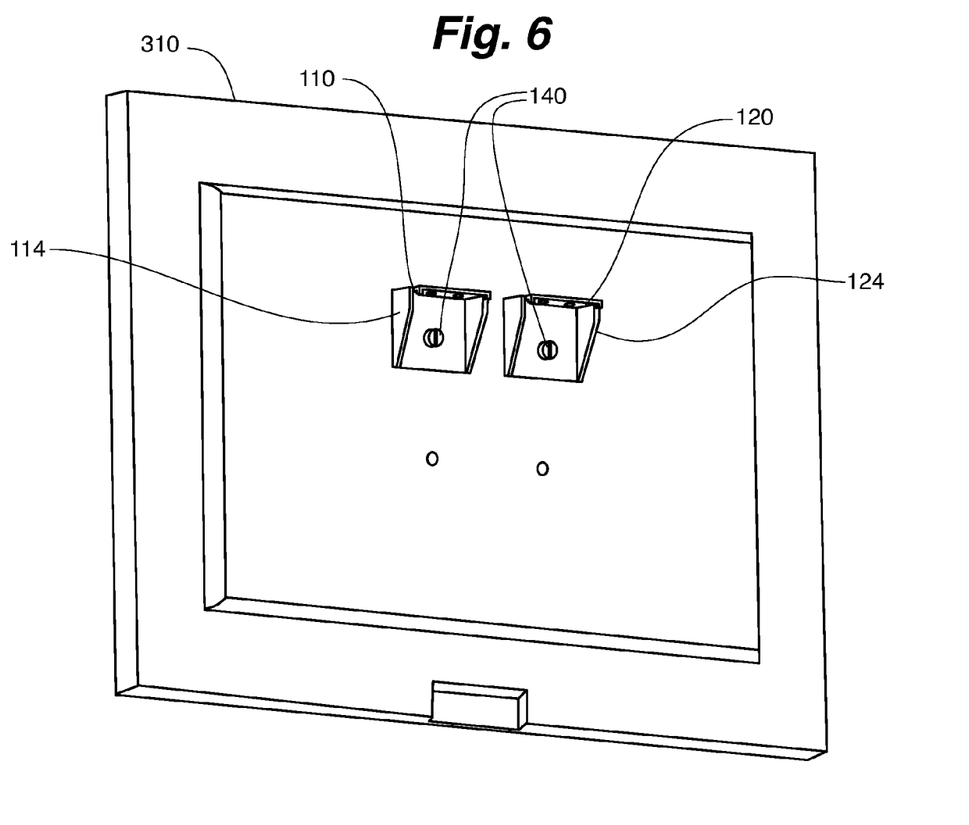
FIG. 6 is a second perspective view of the combination stand and mount in the wall mount configuration coupled with the television.

In the embodiment shown in FIG. 1, the first and second brackets 110, 120 are constructed similarly. Each as an elongated flat face 113, 123 (or pedestal segment) with a first pair of screw holes 112, 122 used to attach the brackets 110, 120 to a monitor mounting bracket (as shown in FIG. 3) and a single third hole 118, 128 that is used to attach the brackets 110, 120 to a monitor (as shown in FIG. 6). The elongated flat face 113, 123 is attached at an approximate right angle to a shorter stub face 111, 121. These stub faces 111, 121 also contain a pair of screw holes 115, 125, which can be used to secure the brackets 110, 120 to the base plate 100 as described below. Each bracket 110, 120 also has two side walls 116, 126 that contact the edges of both the elongated flat faces 113, 123 and the stub faces 111, 121, as shown in FIG. 1. These side walls 116, 126 include a taper portion 117, 127 that angle from proximal to the elongated flat faces 113, 123 to proximal to the stub faces 111, 121. The side walls 116, 126 are preferably provided with hook portions 114, 124, that are used to hook the brackets 110, 120 to the base plate 100 in the wall mount configuration. The taper portions 117, 127 are sized and position to assist the user in properly positioning the television in a wall mount configuration so as to engage the hooks 114, 124 with the base plate 100.

For the stand configuration, the screw holes 115, 125 are used to attach the brackets 110, 120 to the back face 105 of base plate 100. The flat face 113 of bracket 110 and the flat face 123 of bracket 120 are placed together. The screw holes 115, 125 align with screw holes 130 on the base plate 100, and are secured by screws 140. Each bracket 110, 120 also has a pair of screw holes 112, 122 for securing the brackets to a television monitor in the stand configuration.

For the wall mount configuration, screw holes 118, 128 of brackets 110, 120 are used to attach the flat faces 113, 123 of the brackets 110, 120 directly to the back side of a television. The back face 105 of base plate 100 is set against the wall and the screws 140 are inserted into screw holes 150 to secure the base plate 100 to the wall. Each bracket has hooks 114, 124 that insert into notches 170 of the base plate 100. The wall mount configuration will be shown further in relation to FIGS. 5-8.

Figure 2:
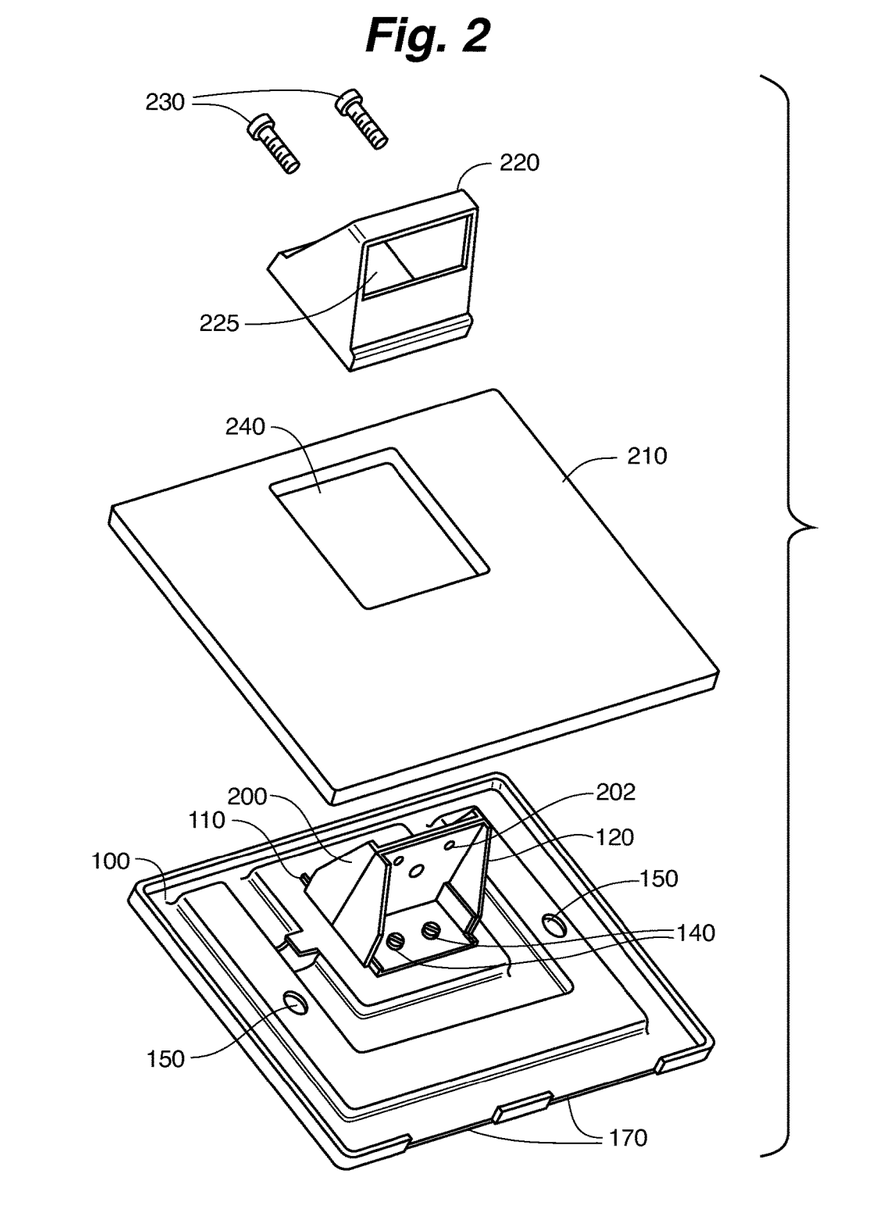
FIG. 2 is a perspective view of the combination stand and mount in a stand configuration.

FIG. 2 is a perspective view of the stand configuration of the present disclosure. As shown in FIG. 2, the brackets 110, 120 are secured to base plate 100 by screws 140. When placed together in the fashion shown in FIG. 2, the two brackets 110, 120 create a bracket assembly 200, with the bracket holes 112 of the first bracket 110 aligning with the bracket holes 122 of the second bracket 120 to create bracket assembly holes 202. A base cover 210 and a bracket cover 220 are placed over the base plate 100 and the bracket assembly 200, respectively, in order to provide a finished look to the stand. The base cover 210 has an opening 240 that allows the bracket assembly 200 to protrude through of the base cover 210 when the cover 210 is positioned over the base plate 100. The bracket cover 220 is placed over the bracket assembly 200. In a preferred embodiment, the base cover 210 and bracket cover 220 completely cover the base plate 100 and the bracket assembly 200. Fasteners, such as a pair of screws 230, can be placed through an opening 225 in the bracket cover 220, and through the bracket assembly holes 202 to secure the television to the stand, as is described in more detail in connection with FIG. 3.

Although FIGS. 1-2 show the bracket assembly 200 being secured to the base plate 100 by screws 140, it is contemplated that alternative means for securing or fastening the bracket assembly 200 could be used. For example, the bracket assembly 200 could be secured to the based plate 100 by one of a mechanical latch; a hook-and-loop-style fastener such as VELCRO®, produced by Velcro USA Inc.; a bolt; a physical adhesive; a magnet; a sliding rail providing a friction fit between the brackets 110, 120 and the base plate 100; and other such securing means that will be evident to one of ordinary skill.

FIG. 3 shows the base plate 100 and bracket assembly 200 combined with the covers 210, 220 into a stand assembly 300. The stand assembly 300 can then itself be combined with a television or monitor 310 and a mounting bracket 330 into the combination 340 shown in this Figure. The bracket assembly 200 and bracket cover 220 together form a pedestal 380 onto which the monitor 310 can be mounted. The back of monitor 310 has a recessed track 320 into which the side edges 335 of the mounting bracket 330 slide. After the mounting bracket 330 is inserted into the recessed track 320, the monitor 310 can be mounted onto the pedestal 380 of the stand assembly 300 by inserting the screws 230 through the bracket assembly holes 202 of the bracket assembly 200 and through the opening 225 of cover 220, and into screw holes 337 of the bracket 330.

Figure 4:
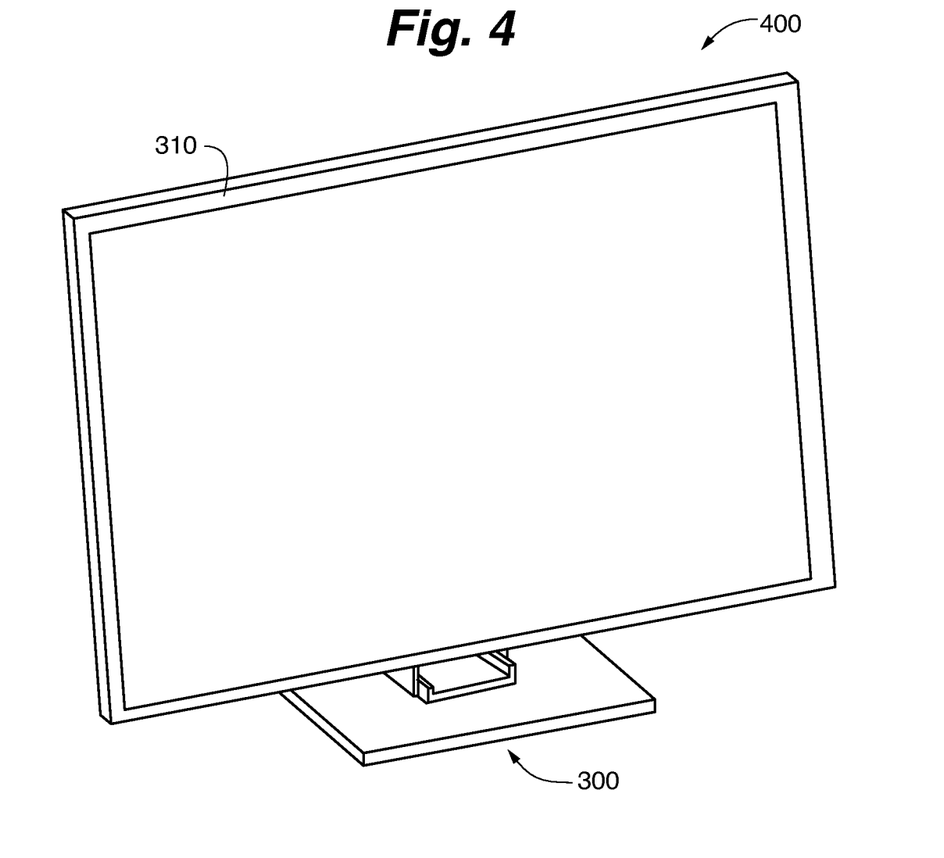
FIG. 4 is a second perspective view of the stand configuration coupled with the television.

FIG. 4 shows the monitor 310 and the stand assembly 300 in an upright stand configuration 400.

Figure 5:
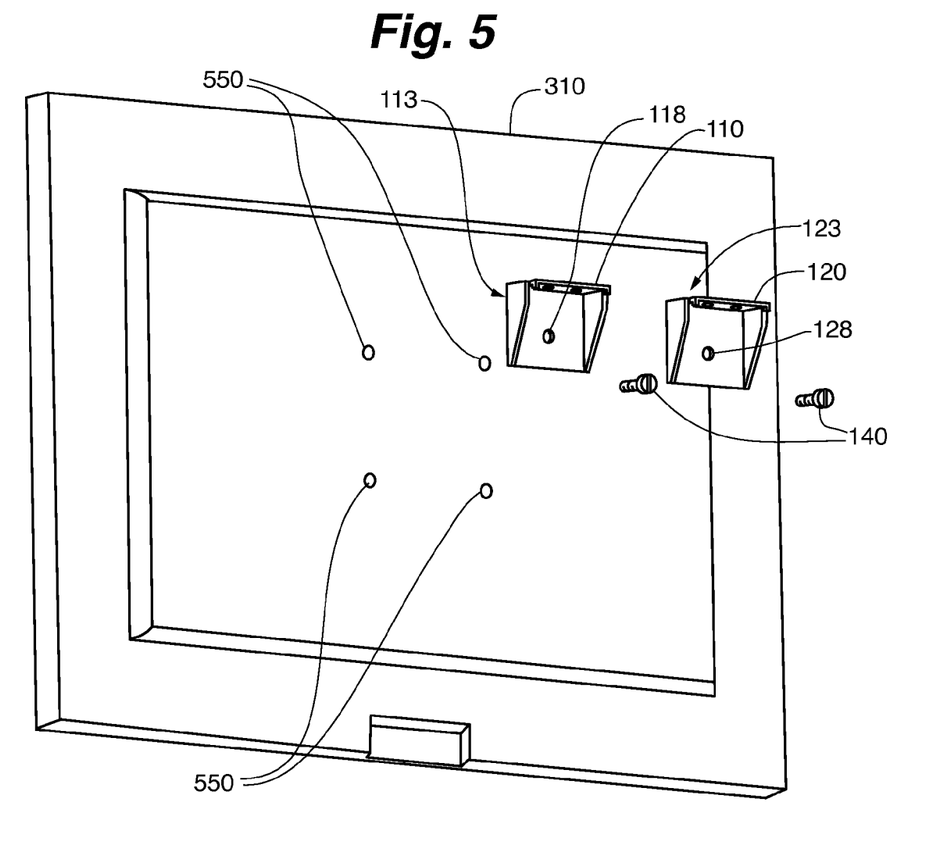
FIG. 5 is a first perspective view of the combination stand and mount in a wall mount configuration coupled with the television.

FIG. 5 shows the modular components of the combination stand and wall mount in combination with the television 310 in a wall mount configuration. The flat faces 113, 123 of brackets 110, 120 are placed in contact with the monitor 310. A set of monitor screw holes 550 allow the brackets 110, 120 to be secured to the monitor 310 by screws 140 through the screw holes 118, 128 of brackets 110, 120. In one embodiment, the screw holes 550 on the back of the monitor 310 conform to the Video Electronics Standards Association (VESA) Flat Display Mounting Interface Standard (FDMI). The FDMI Standard calls for monitors to have four such screw holes 550 in a standardized size and pattern. This allows a single mounting assembly to be used for different monitors, regardless of the manufacturer.

FIG. 6 is a second perspective view of the combination stand and mount in the wall mount configuration in conjunction with the television 310. In FIG. 6, the brackets 110, 120 are secured to the television 310 by screws 140.

Although FIGS. 5-6 show the brackets 110, 120 being secured to the monitor 310 by screws 140, it is contemplated that alternative means for securing or fastening the brackets 110, 120 could be used. For example, the brackets 110, 120 could be secured by one of a mechanical latch; a hook-and-loop-style fastener such as VELCRO®, produced by Velcro USA Inc.; a bolt; a physical adhesive; a magnet; a sliding rail providing a friction fit between the brackets 110, 120 and the monitor 310; and other such securing means that will be evident to one of ordinary skill.

Figure 7:
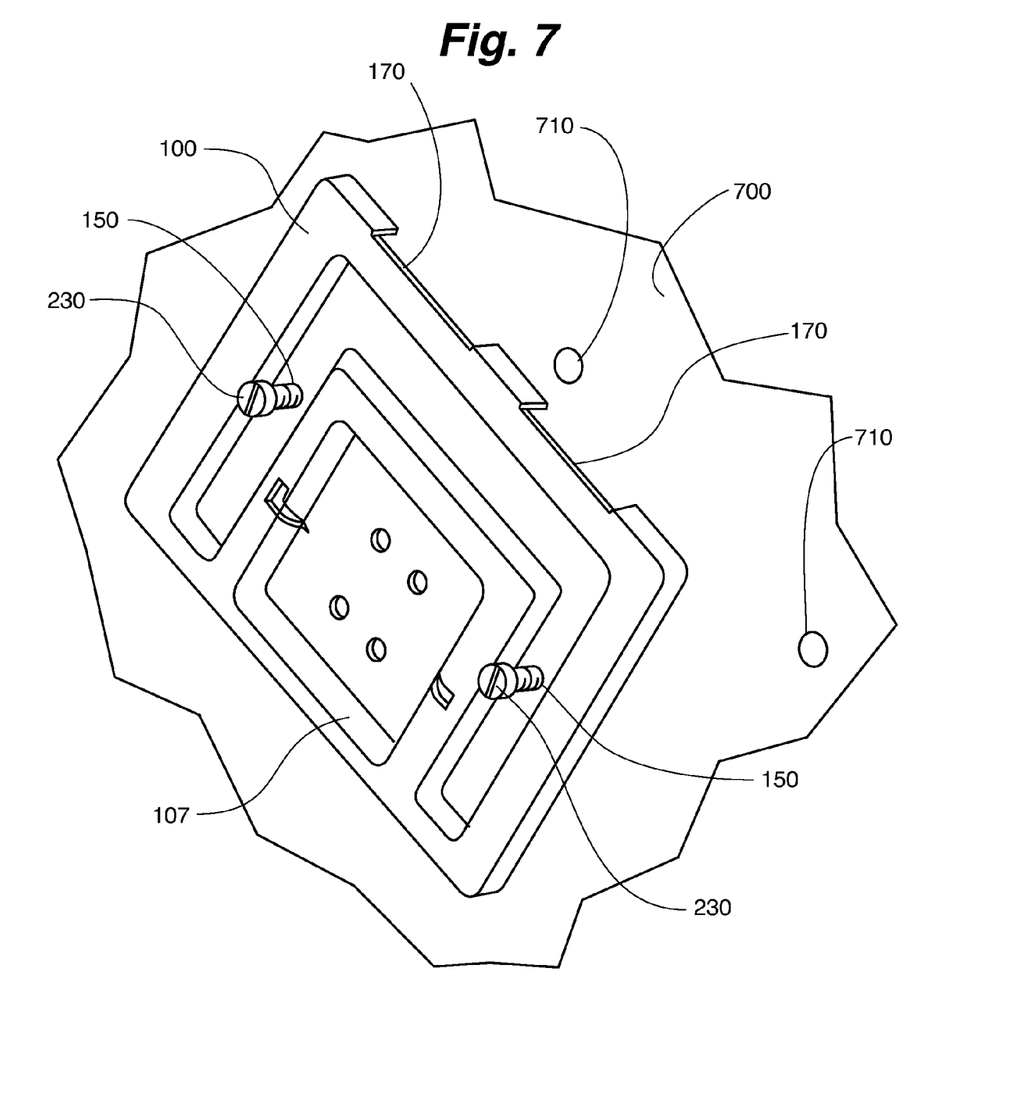
FIG. 7 is a perspective view of the combination stand and mount in the wall mount configuration.

FIG. 7 is a perspective view of the base plate 100 for use in the wall mount configuration. When using the base plate 100 to mount the television 310 to a wall 700, the front face 107 of the base plate 100 faces out from the wall 700. Screws 230 can be used to secure the base plate 100 through screw holes 150 into mounting holes 710 in the wall 700. The two notches 170 in the base plate 100 will provide a hanger for the television 310.

Figure 8:
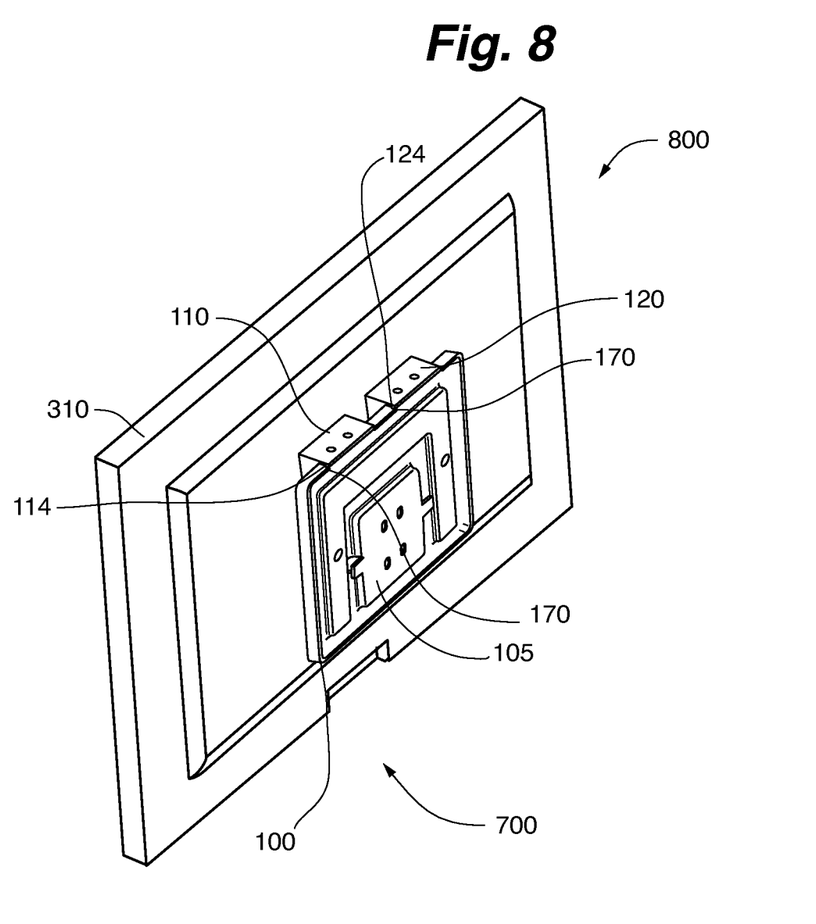
FIG. 8 is a perspective view of the combination stand and mount in the wall mount configuration coupled with the television.

FIG. 8 is a perspective view of the wall mount configuration 800 as viewed from behind the wall 700 with the wall 700 not shown for purposes of showing this aspect of the invention. The brackets 110, 120 are hung from the base plate 100 by securing the hooks 114, 124 into the notches 170 in the base plate 100. The back face 105 of the base plate 100 faces the wall 700 (not shown). In the simplest implementation of the wall mount configuration 800, the hooks 114, 124 rest inside the notches 170 and the monitor 310 is held in place by gravity. However, to provide extra security, it is contemplated that means could be provided to lock the brackets 110, 120 into the notches 170 when the brackets 110, 120 are hung by the hooks 114, 124. For example, the locking mechanism could be a mechanical latch, a screw, a bolt, or a sliding bar. Other means for securing the brackets 110, 120 to the base plate 100 will be apparent to one of ordinary skill.

Although the combination stand and mount is shown in FIGS. 1-8 as having a pair of brackets 110, 120, it is contemplated that the combination stand and mount could be modified to use only a single bracket. In an embodiment having only a single bracket, the base plate would be modified to have a single notch in the center of one edge of the base plate, instead of the two notches 170.

Figure 9:
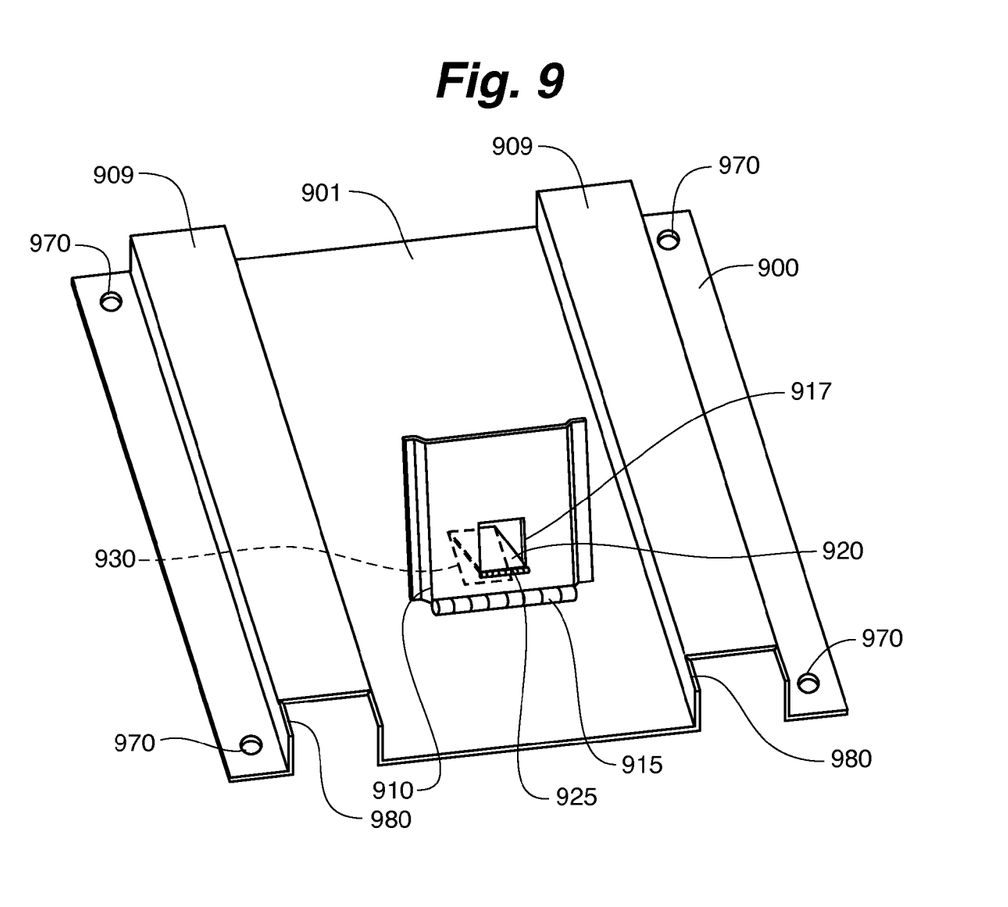
FIG. 9 is a perspective view of an alternative embodiment of a combination television monitor stand and mount.

FIG. 9 is a perspective view of an alternative embodiment of a combination television monitor stand and mount. As shown in FIG. 9, a combination stand and mount 900 has a base plate 901, which has raised rails 909 along the length of the base plate 901. Each rail 909 has a notch 980. The notches 980 serve the same purpose as the notches 170 in FIGS. 1-8. When the combination stand and mount 900 is used in the wall mount configuration, a pair of brackets is attached to the back of a television, as in FIG. 6. The base plate 901 is secured to a wall by screws inserted into screw-holes 970. Hooks on the brackets secure the brackets onto the notches 980. The monitor is held in place by gravity, and may also optionally have an additional locking mechanism to further secure the television to the base plate 901 in the wall mount configuration, as described in relation to FIG. 8.

When in the stand configuration, the alternative embodiment of FIG. 9 replaces the pedestal 380 shown in FIG. 3 with a hinged neck 910. The neck 910 is sized to slide into a recessed track, such as the recessed track 320 of the monitor 310 in FIG. 3. In one embodiment, the neck 910 is generally flat. In an alternative embodiment, the neck 910 may have a "keyed" shape, in which the cross-section of the neck 910 has angled corners that are shaped to snugly slide into a recessed track 320. Preferably, the keyed shape allows the recessed track 320 to slide onto the neck 910 in only a single orientation with respect to the base plate 901. This will prevent a user from placing the monitor 310 onto the neck 910 backward.

Figure 10:
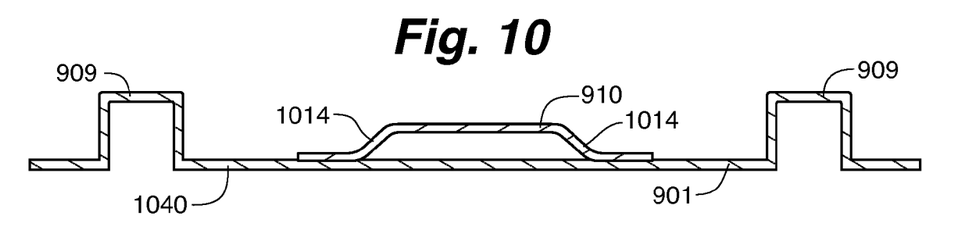
FIG. 10 is a cross-sectional view of a hinged stand neck in the stowed configuration.

FIG. 10 shows a cross-sectional view of the neck 910 in the stowed position. Both the neck 910 and the two rails 909 are raised above the bottom section 1040 of base plate 901. The neck 910 has a keyed shape characterized by angled segments 1014. The segments 1014 allow the neck 910 to be inserted into the recessed track 320 of television 310 in only one orientation.

Returning to FIG. 9, a hinge 915 affixes the neck 910 to the base plate 901 and allows the neck 910 to pivot between a stowed position and an upright position. When the combination stand and mount 900 is in the wall mount configuration, the neck 910 rests against the base plate 901 in the stowed position. When the combination stand and mount 900 is used in the monitor stand configuration, the neck 910 is rotated on the hinge 915 into an upright position.

The neck 910 has a cutout 917 in the center of the neck 910. The cutout 917 has a hinge 925 affixed to one side of the cutout 917. The hinge attaches a locking lever arm 920 to the neck 910 in order to secure the neck 910 in the upright position. The locking lever arm 920 is braced by a notched section 930 in the base plate 901. In one embodiment, the locking lever arm 920 is sized to fit inside of the cutout 917 when the neck 910 is in the stowed position. In a preferred embodiment, the locking lever arm 920 includes a locking mechanism that locks the locking lever arm 920 in place when the neck 910 rotates into the upright position. The locking mechanism could be a mechanical latch, a screw, a bolt, a locking bar, or other such mechanism to prevent the locking lever arm 920 from moving when the neck 910 is in the upright position.

An optional cover could be provided for the combination stand and mount 900 when in the stand configuration, similar to the cover 210 shown in FIG. 2.

Figure 11:
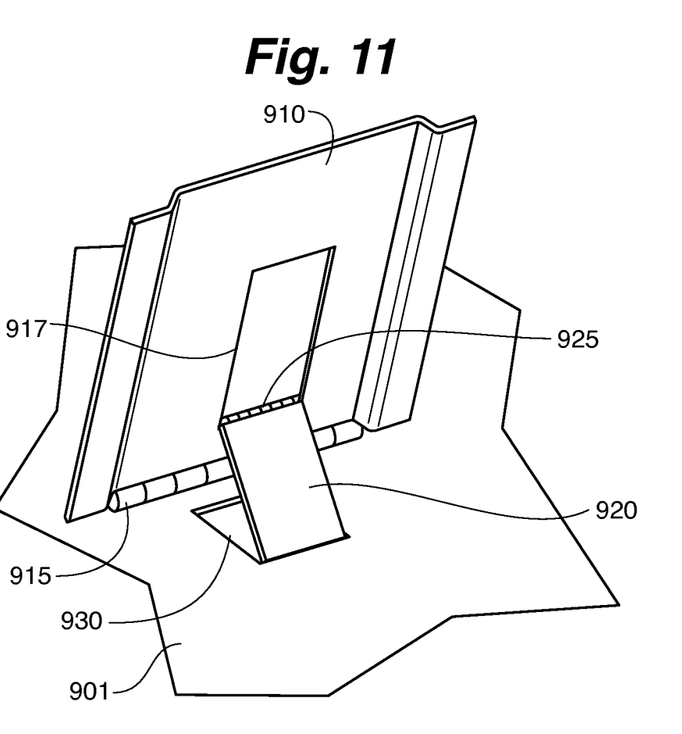
FIG. 11 is a perspective view of a hinged neck and locking lever arm combination for the alternative embodiment of the combination stand and mount.
Figure 12:
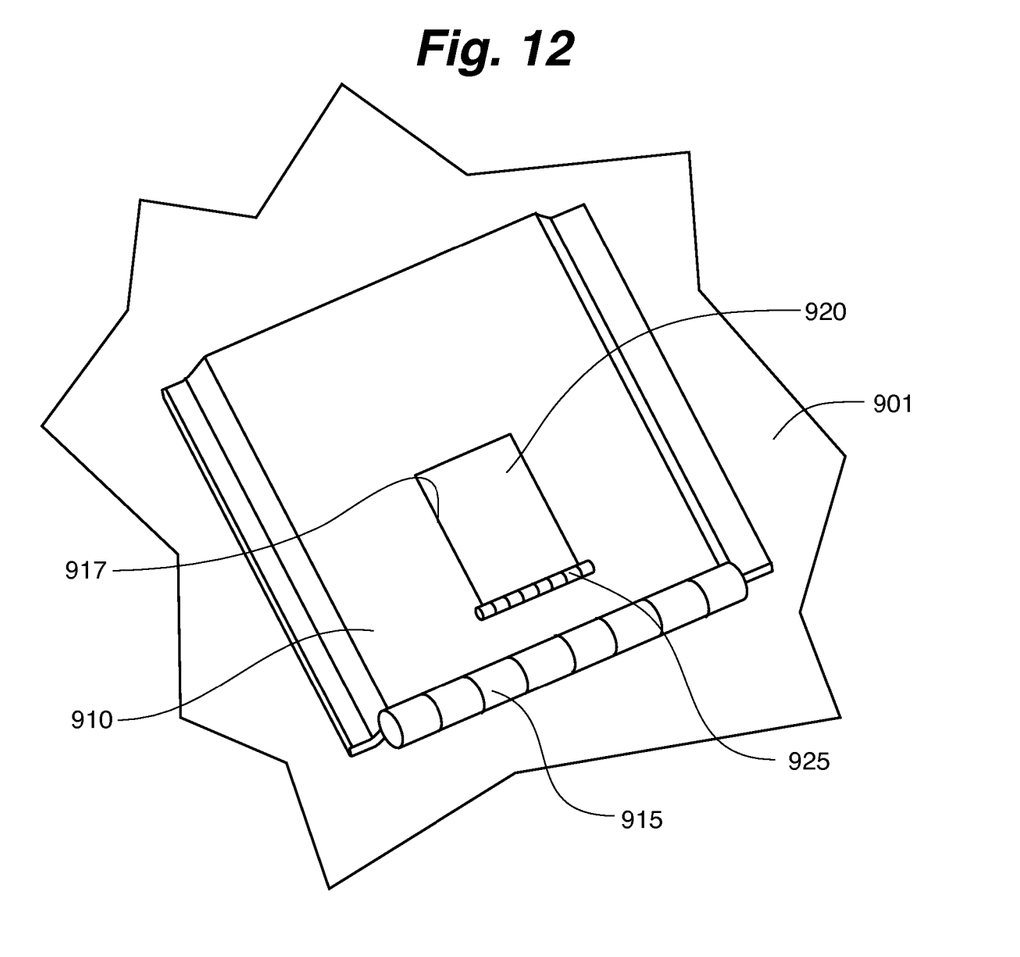
FIG. 12 is a perspective view of the hinged neck and locking lever arm in the stowed configuration.

FIG. 11 is a second perspective view of the hinged neck 910 and locking lever arm 920 combination in the upright position. The locking lever arm 920 can pivot on the hinge 925 to fit within the cutout 917. FIG. 12 shows the neck 910 and the locking lever arm 920 in the stowed position.

Figure 13:
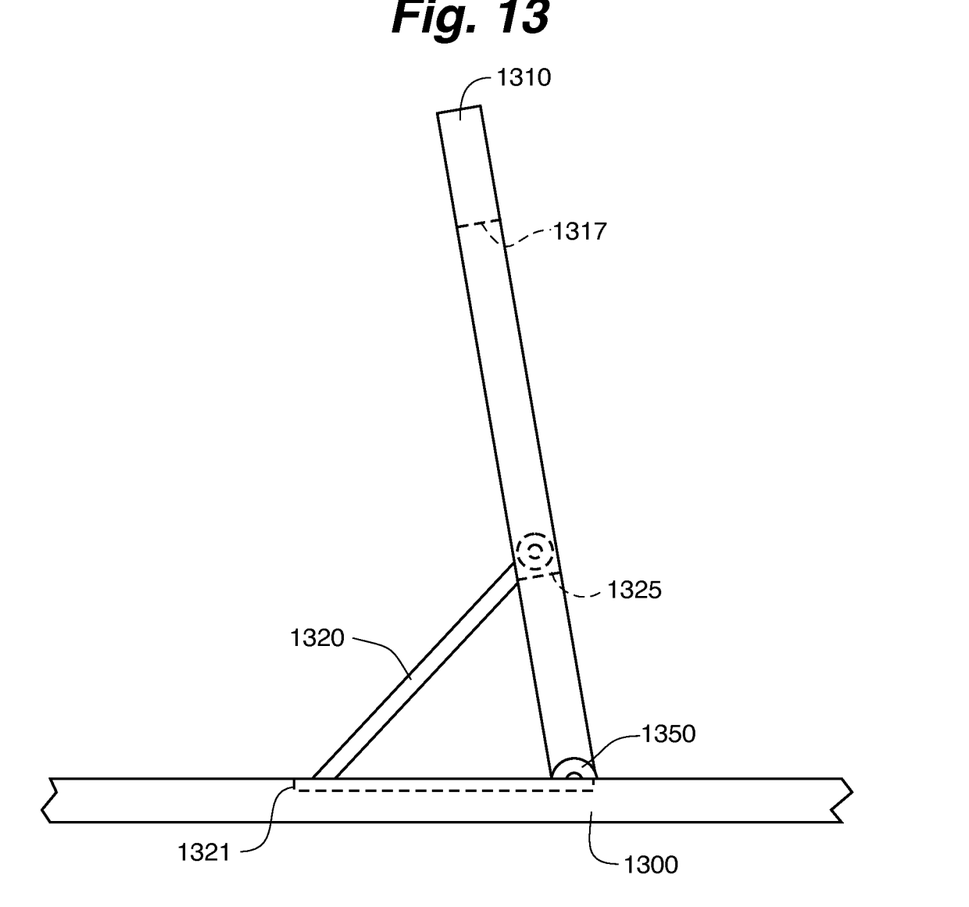
FIG. 13 is a side view of the hinged bracket and locking lever arm combination.

FIG. 13 is a side view of one embodiment of a locking lever arm for use with the combination stand and mount. This embodiment includes a base plate 1300 and a neck 1310 pivotably attached to the base plate 1300 by a first hinge 1350. A locking lever arm 1320 is pivotably attached to the neck 1310 by a second hinge 1325. Neck 1310 includes a cutout section 1317 in which the locking lever arm 1320 can sit when the neck 1310 is in the stowed position. A notched section 1321 of the base plate 1300 holds the locking lever arm 1320 in place when the locking lever arm 1320 supports the neck 1310. A means for locking the locking lever arm 1320 in place in the notch 1321 could be provided. For example, a mechanical latch, a screw, a bolt, a locking bar, or other such locking mechanisms could be used to lock the locking lever arm 1320 in place.

Figure 14:
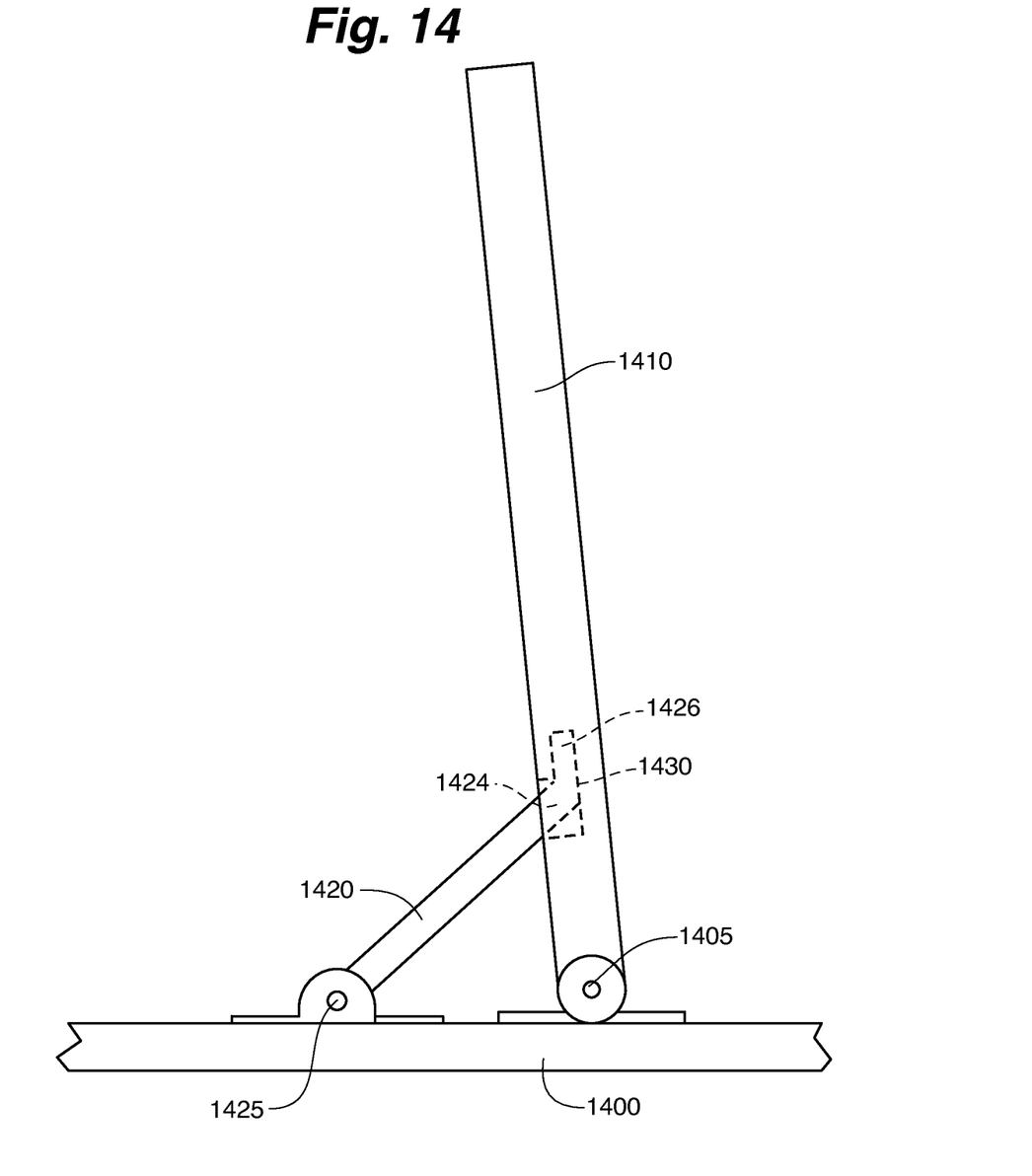
FIG. 14 is a side view of an alternative embodiment of a hinged bracket and locking lever arm combination.

FIG. 14 is a side view of a second embodiment of a locking lever arm for use with the combination stand and mount. In the embodiment of FIG. 14, a stand neck 1410 is pivotably attached to a base plate 1400 by a first hinge 1405, and the locking lever arm 1420 is pivotably attached to the base plate 1400 by a second hinge 1425. A bracing end 1424 of the locking lever arm 1420 inserts into a recess 1430 within the neck 1410. The bracing end 1424 could be secured in a number of different ways. In the embodiment of FIG. 14, the bracing end 1424 has a tip protrusion 1426 that slides upward into matching portion of a recess 1430 to secure the locking lever arm 1420 in place. This same protrusion-and-recess mechanism could be used with the embodiment shown in FIG. 13 to secure locking lever arm 1320 into the notched section 1321 of the base plate 1300. Other methods of locking the locking lever arm 1420 to the neck 1410 are contemplated, and will be apparent to one of ordinary skill.

Figure 15:
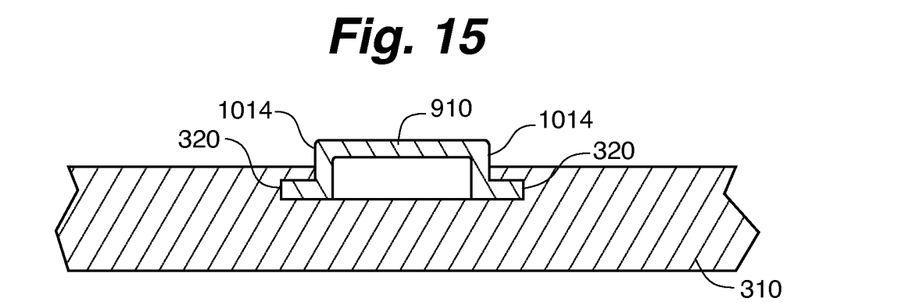
FIG. 15 is a cross-sectional view of the combination stand and mount coupled with the monitor.

FIG. 15 shows a cross-sectional view of the neck 910 inserted into the recessed track 320 of the monitor 310. As demonstrated in FIG. 15, the keyed shape of the neck 910 allows the neck 910 to inserted into the recessed track 320 in only one orientation.

The many features and advantages of the invention are apparent from the above description. Numerous modifications and variations will readily occur to those skilled in the art. Since such modifications are possible, the invention is not to be limited to the exact construction and operation illustrated and described. Rather, the present invention should be limited only by the following claims.

What is claimed is:

1. A monitor attachment assembly comprising:
   a monitor;
   at least one bracket, the at least one bracket having a monitor-fastening site and a surface-fastening site; and
   a base plate, wherein the surface-fastening site is engaged to the base plate, the surface-fastening site defines at least one hook and the base plate defines at least one notch;
   the assembly having a stand configuration wherein the monitor-fastening site is engaged to a first monitor location;
   a bracket cover, the bracket cover being positioned over the at least one bracket to form a pedestal to which the monitor is mounted in the stand configuration;
   the assembly having a wall mount configuration wherein the monitor-fastening site is engaged to a second monitor location;
   the at least one hook being engaged to the at least one notch in the wall mount configuration; and
   the first monitor location being a location on the monitor different than the second monitor location.

2. The assembly of claim 1, wherein the monitor has a bottom side and a back side, the first monitor location being a location on the bottom side of the monitor, the second monitor location being a location on the back side of the monitor.

3. The assembly of claim 1, wherein the monitor-fastening site forms an approximate right angle with the surface-fastening site.

4. The assembly of claim 1, wherein in the stand configuration the monitor-fastening site is positioned above the surface-fastening site.

5. The assembly of claim 1, wherein in the wall mount configuration the monitor-fastening site is positioned below the surface-fastening site.

6. The assembly of claim 1, further comprising a locking mechanism for locking the at least one hook into the at least one notch.

7. The assembly of claim 1, wherein the base plate is engaged to a wall.

8. The assembly of claim 1, wherein the monitor-fastening site is engaged to the monitor by friction fit.

9. The assembly of claim 1, wherein the monitor-fastening site defines at least one screw hole.

10. The assembly of claim 9, wherein the at least one screw hole is a plurality of screw holes.

11. The assembly of claim 9, further comprising at least one screw, the at least one screw securing the monitor-fastening site to the monitor.

12. The assembly of claim 1, wherein the at least one bracket consists of two brackets.

13. The assembly of claim 1 wherein the bracket cover is elevated above the base plate.

14. The assembly of claim 13, wherein the pedestal further comprises a base plate cover, the base plate cover covering the base plate and defining an opening through which the at least one bracket and bracket cover extend above the base plate.

15. The assembly of claim 13, wherein the at least one bracket and the bracket cover define at least one complementary opening for the engagement of at least one screw, the at least one screw engaging the monitor to the monitor-fastening site.

\* \* \* \* \*

UNITED STATES PATENT AND TRADEMARK OFFICE
CERTIFICATE OF CORRECTION

PATENT NO. : 9,578,762 B2  
APPLICATION NO. : 14/753492  
DATED : February 21, 2017  
INVENTOR(S) : Timothy M. Cassidy, Yang Du and He Kaixuan Page 1 of 1

It is certified that error appears in the above-identified patent and that said Letters Patent is hereby corrected as shown below:

On the Title Page

At (72) Inventors, Line 3:
Delete "Kaizuan" and insert --Kaixuan--.

Signed and Sealed this
Sixteenth Day of June, 2020

Andrei Iancu
*Director of the United States Patent and Trademark Office*